United States Patent
Cai et al.

(10) Patent No.: US 12,352,822 B2
(45) Date of Patent: Jul. 8, 2025

(54) CELL SAMPLING CIRCUIT, CIRCUIT FAULT EARLY WARNING METHOD, AND BATTERY MANAGEMENT SYSTEM

(71) Applicant: CONTEMPORARY AMPEREX TECHNOLOGY (HONG KONG) LIMITED, Hong Kong (CN)

(72) Inventors: Yihua Cai, Ningde (CN); Feidan Gao, Ningde (CN)

(73) Assignee: CONTEMPORARY AMPEREX TECHNOLOGY (HONG KONG) LIMITED, Hong Kong (CN)

(*) Notice: Subject to any disclaimer, the term of this patent is extended or adjusted under 35 U.S.C. 154(b) by 391 days.

(21) Appl. No.: 17/940,354

(22) Filed: Sep. 8, 2022

(65) Prior Publication Data

US 2023/0221378 A1    Jul. 13, 2023

Related U.S. Application Data

(63) Continuation of application No. PCT/CN2022/089552, filed on Apr. 27, 2022.

(30) Foreign Application Priority Data

Jan. 7, 2022 (CN) .................. 202210018432.X

(51) Int. Cl.
*G01R 31/396* (2019.01)
*G01R 31/3842* (2019.01)
(Continued)

(52) U.S. Cl.
CPC ....... *G01R 31/396* (2019.01); *G01R 31/3842* (2019.01); *H01M 10/425* (2013.01);
(Continued)

(58) Field of Classification Search
CPC ............ G01R 31/3842; G01R 31/3835; G01R 31/396; G01R 31/36; G01R 31/3646;
(Continued)

(56) References Cited

U.S. PATENT DOCUMENTS 5,254,930 A    10/1993  Daly
8,570,047 B1   10/2013  Davies et al.
(Continued)

FOREIGN PATENT DOCUMENTS

CN    1319189 A    10/2001
CN    101261297 A   9/2008
(Continued)

OTHER PUBLICATIONS

The European Patent Office (EPO) The Extended European Search Report for Application No. 22743435.4 Nov. 28, 2023 5 Pages.
(Continued)

*Primary Examiner* — Huy Q Phan
*Assistant Examiner* — Martin Walter Braunlich
(74) *Attorney, Agent, or Firm* — ANOVA LAW GROUP, PLLC

(57) ABSTRACT

A cell sampling circuit includes a plurality of target units sequentially connected in a series connection in a daisy-chain communication manner and one or more transformer units each connected between two successive target units of the plurality of target units. Each of the target units is configured to acquire an impedance of at least one transformer unit connected to the target unit, and judge, based on the acquired impedance, whether to perform circuit abnormality early warning.

20 Claims, 3 Drawing Sheets

(51) Int. Cl.
H01M 10/42 (2006.01)
H01M 10/48 (2006.01)
H02J 7/00 (2006.01)

(52) U.S. Cl.
CPC ......... H01M 10/482 (2013.01); H02J 7/0047 (2013.01); H01M 2010/4271 (2013.01)

(58) Field of Classification Search
CPC .............. G01R 31/3647; G01R 31/382; G01R 19/16542; G01R 15/18; G01R 19/16576; G01R 19/1659; G01R 31/00; G01R 31/389; G01R 31/392; G01R 31/62; H01M 10/482; H01M 2010/4271; H01M 10/425; H01M 2010/4278; H01M 10/4207; H01M 10/441; H01M 10/48; H02J 7/0047; G06F 13/4247
See application file for complete search history.

(56) References Cited

U.S. PATENT DOCUMENTS

| | | | |
|---|---|---|---|
| 10,785,065 B2 * | 9/2020 | Shuvalov | H04L 25/0272 |
| 11,177,672 B2 * | 11/2021 | No | H01M 10/482 |
| 11,817,565 B2 * | 11/2023 | Komiyama | H02J 7/0047 |
| 2002/0163339 A1 | 11/2002 | Friel et al. | |
| 2013/0057292 A1 * | 3/2013 | Hasegawa | H01M 8/04559 324/430 |
| 2016/0169979 A1 * | 6/2016 | Min | H01M 8/04649 324/430 |
| 2019/0280903 A1 | 9/2019 | Shuvalov | |
| 2020/0031393 A1 | 1/2020 | Hirota et al. | |
| 2020/0313934 A1 | 10/2020 | Shuvalov | |
| 2022/0294039 A1 * | 9/2022 | Cho | H01M 10/425 |
| 2024/0283039 A1 * | 8/2024 | Hwang | G01R 31/392 |

FOREIGN PATENT DOCUMENTS

| | | | |
|---|---|---|---|
| CN | 101409455 A | 4/2009 | |
| CN | 104316826 A | 1/2015 | |
| CN | 104603627 A | 5/2015 | |
| CN | 106383508 A | 2/2017 | |
| CN | 205982571 U | 2/2017 | |
| CN | 206114822 U | 4/2017 | |
| CN | 106816905 A | 6/2017 | |
| CN | 108172912 A | 6/2018 | |
| CN | 108872764 A | 11/2018 | |
| CN | 110967648 A | 4/2020 | |
| CN | 111198309 A | 5/2020 | |
| CN | 111537916 A | 8/2020 | |
| CN | 211417022 U | 9/2020 | |
| CN | 111756349 A | 10/2020 | |
| CN | 112803509 A | 5/2021 | |
| CN | 112986835 A | 6/2021 | |
| CN | 215180734 U | 12/2021 | |
| JP | H06222101 A | 8/1994 | |
| JP | 2011252752 A | 12/2011 | |
| JP | 2014147138 A | 8/2014 | |
| KR | 20180044704 A | 5/2018 | |
| WO | 0005596 A1 | 2/2000 | |

OTHER PUBLICATIONS

The World Intellectual Property Organization (WIPO) International Search Report and Written Opinion for PCT/CN2022/089552 Oct. 10, 2022 13 Pages (including translation).

China National Intellectual Property Administration (CNIPA) Office Action 1 for 202210018432.X Jun. 13, 2023 16 Pages (including translation).

F. Yang, "Research of sweep frequency impedance to determine transformer winding deformation after short-circuit impact", IEEE, Aug. 21, 2017. p. 68-72.

Hui Li et al. "Winding deformation fault diagnosis technology for large transformer", "The Journal of New Industrialization", vol. 11 Issue 2, Feb. 2021, p. 47-48 4 Pages (including translation).

China National Intellectual Property Administration (CNIPA) Notice of Grant of Invention Patent Right for Application No. 202210018432.X Aug. 28, 2023 9 Pages (including translation).

Japan Patent Office (JPO) The Office Action For JP Application No. 2022-548239 Mar. 19, 2024 6 Pages (Translation Included).

Japan Patent Office (JPO) The Decision to Grant a Patent For JP Application No. 2022-548239 Jul. 2, 2024 5 Pages (Translation Included ).

Korean Intellectual Property Office (KIPO) The Request for the Submission of an Opinion For KR Application No. 9-5-2024-060173111 Jul. 17, 2024 9 Pages (Translation Included ).

* cited by examiner

CELL SAMPLING CIRCUIT, CIRCUIT FAULT EARLY WARNING METHOD, AND BATTERY MANAGEMENT SYSTEM

CROSS-REFERENCE TO RELATED APPLICATIONS

The present application is a continuation of International Application No. PCT/CN2022/089552, filed on Apr. 27, 2022, which claims priority to Chinese patent application No. 202210018432.X filed on Jan. 7, 2022 and entitled "CELL SAMPLING CIRCUIT, CIRCUIT FAULT EARLY WARNING METHOD, AND BATTERY MANAGEMENT SYSTEM," the entire contents of both of which are incorporated herein by reference.

TECHNICAL FIELD

The present application relates to the field of battery management technologies, and in particular, to a cell sampling circuit, a circuit fault early warning method, and a battery management system.

BACKGROUND ART

In order to detect the abnormality of a battery pack in time, a Battery Management System (BMS) generally collects state data such as voltage and temperature of cells in the battery pack through a cell sampling circuit.

At present, once a fault occurs in the actual use of the cell sampling circuit, the communication of the cell sampling circuit will be interrupted, and the state data of cells will be unable to be collected due to the communication interruption. In a case where the state data of the cells cannot be collected, in order to ensure the safety of the cells, a high-voltage circuit of the battery pack will be quickly disconnected to ensure that the battery pack is in a safe state. Although this method ensures the safety of the battery pack, it causes inconvenience for a user to use the battery pack and affects the user experience.

SUMMARY

In view of the above problems, a cell sampling circuit, a circuit fault early warning method, and a battery management system are proposed in the present application, a main purpose of which is to provide early warning for an abnormality in the cell sampling circuit.

In a first aspect, a cell sampling circuit is provided in the present application, the cell sampling circuit including: a plurality of target units sequentially connected in series in a daisy-chain communication manner, a transformer unit being connected between every two successive target units; wherein the target unit arranged at the first place in the series connection is a main control unit, and the rest of the target units are all cell sampling units; each of the target units is configured to acquire an impedance of the transformer unit connected thereto, and judge, based on the acquired impedance, whether to perform a circuit abnormality early warning.

The cell sampling circuit provided by an embodiment of the present application includes a plurality of target units sequentially connected in series in a daisy-chain communication manner, wherein the target unit arranged at the first place in the series connection is the main control unit, and the rest of the target units are the cell sampling units. A transformer unit is connected between every two successive target units. Each of the target units is configured to acquire an impedance of the transformer unit connected thereto, and judge, based on the acquired impedance, whether to perform a circuit abnormality early warning. The impedance acquired by the target unit can reflect a situation that a winding of the transformer unit connected thereto is excessively pulled up, and can reflect the magnitude of a risk of disconnection of the winding of the transformer unit. Therefore, in the solution provided by the embodiment of the present application, by the method of detecting the impedance of the transformer unit connected thereto, the target unit can detect an abnormal situation of the transformer unit in time, so that when the transformer unit is abnormal and no disconnection fault has occurred yet, a circuit abnormality early warning is provided, so that the user handles the circuit abnormality in advance according to the circuit abnormality early warning.

In some embodiments, a target unit located upstream of the two successive target units is connected to a transformer input module of the transformer unit, and a target unit located downstream is connected to a transformer output module of the transformer unit; each of the target units is respectively configured to acquire an impedance of a target module connected thereto, and judge, based on the acquired impedance, whether to perform a circuit abnormality early warning, wherein the target module is determined based on a connection relationship between the target unit and the transformer unit.

In some embodiments, when the target unit is a cell sampling unit, the target module includes a transformer output module connected thereto and a transformer input module connected thereto, and the acquired impedance includes a first impedance and a second impedance, the first impedance is the impedance of the transformer output module connected thereto, and the second impedance is the impedance of the transformer input module connected thereto.

In some embodiments, when the target unit is a main control unit, the target module includes a transformer input module connected thereto, the acquired impedance is the second impedance, and the second impedance is the impedance of the transformer input module connected thereto.

In some embodiments, each of the target units is configured to perform a circuit abnormality early warning when it is determined that the acquired impedance of the target module reaches an impedance threshold corresponding to the target module.

In some embodiments, each of the target units is configured to determine an abnormal transformer unit, and issue a circuit abnormality early warning for the abnormal transformer unit, wherein the abnormal transformer unit is a transformer unit to which the target module whose impedance reaches the corresponding impedance threshold belongs.

In some embodiments, the transformer output module includes: a first winding, a first switch element, a second switch element, a first connection circuit, and a second connection circuit; a first end of the first winding is connected to a first end of the first switch element through the first connection circuit, and a second end is connected to a first end of the second switch element through the second connection circuit; and a second end of the first switch element and a second end of the second switch element are respectively connected to the cell sampling unit.

In some embodiments, the cell sampling unit includes: a first voltage sampling circuit, a second voltage sampling circuit, a first voltage adjustment circuit, and a control chip;

a first end of the first voltage adjustment circuit is connected to a first node, a second end is connected to a ground wire; a first end of the first voltage sampling circuit is connected to the first node, and a second end is connected to a first pin of the control chip; a first end of the second voltage sampling circuit is connected to a second node, and a second end is connected to a second pin of the control chip; the first node is connected to the second end of the first switch element, and is connected to a third pin of the control chip; the second node is connected to the second end of the second switch element, and is connected to a fourth pin of the control chip.

In some embodiments, the control chip is configured to collect a first sampling voltage corresponding to the first voltage sampling circuit and a second sampling voltage corresponding to the second voltage sampling circuit, and determine the first impedance based on the first sampling voltage, the second sampling voltage, and a first resistance of the first voltage adjustment circuit.

In some embodiments, the cell sampling unit further includes: a second voltage adjustment circuit and a third voltage sampling circuit; a first end of the second voltage adjustment circuit is connected to the second node, and a second end is connected to a first end of the third voltage sampling circuit; and a second end of the third voltage sampling circuit is connected to a fifth pin of the control chip.

In some embodiments, the control chip is configured to collect a second sampling voltage corresponding to the second voltage sampling circuit and a third sampling voltage corresponding to the third voltage sampling circuit, and determine the first impedance based on the second sampling voltage, the third sampling voltage, a first resistance of the first voltage adjustment circuit, and a second resistance of the second voltage adjustment circuit.

In some embodiments, the control chip is configured to collect a first sampling voltage corresponding to the first voltage sampling circuit and a third sampling voltage corresponding to the third voltage sampling circuit, and determine the first impedance based on the first sampling voltage, the third sampling voltage, a first resistance of the first voltage adjustment circuit, and a second resistance of the second voltage adjustment circuit.

In some embodiments, the first impedance is a sum of an impedance of the first winding, an impedance of the first switch element, an impedance of the second switch element, an impedance of the first connection circuit, and an impedance of the second connection circuit in the transformer output module under daisy-chain communication.

In some embodiments, the transformer input module includes: a second winding, a third switch element, and a fourth switch element; a first end of the second winding is connected to a first end of the third switch element, and a second end is connected to a first end of the fourth switch element; and a second end of the third switch element and a second end of the fourth switch element are respectively connected to the target unit.

In some embodiments, the target unit includes: a fourth voltage sampling circuit, a fifth voltage sampling circuit, a third voltage adjustment circuit, and a control chip; a first end of the third voltage adjustment circuit is connected to a third node, a second end is connected to a ground wire; a first end of the fourth voltage sampling circuit is connected to the third node, and a second end is connected to a sixth pin of the control chip; a first end of the fifth voltage sampling circuit is connected to a fourth node, and a second end is connected to a seventh pin of the control chip; the third node is connected to a second end of the third switch element, and is connected to an eighth pin of the control chip; the fourth node is connected to a second end of the fourth switch element, and is connected to a ninth pin of the control chip.

In some embodiments, the control chip is configured to collect a fourth sampling voltage corresponding to the fourth voltage sampling circuit and a fifth sampling voltage corresponding to the fifth voltage sampling circuit, and determine the second impedance based on the fourth sampling voltage, the fifth sampling voltage, and a third resistance of the third voltage adjustment circuit.

In some embodiments, the target unit further includes: a fourth voltage adjustment circuit and a sixth voltage sampling circuit; a first end of the fourth voltage adjustment circuit is connected to the fourth node, and a second end is connected to a first end of the sixth voltage sampling circuit; and a second end of the sixth voltage sampling circuit is connected to a tenth pin of the control chip.

In some embodiments, the control chip is configured to collect a sixth sampling voltage corresponding to the sixth voltage sampling circuit and a fifth sampling voltage corresponding to the fifth voltage sampling circuit, and determine the second impedance based on the sixth sampling voltage, the fifth sampling voltage, a third resistance of the third voltage adjustment circuit, and a fourth resistance corresponding to the fourth voltage adjustment circuit.

In some embodiments, the control chip is configured to collect a sixth sampling voltage corresponding to the sixth voltage sampling circuit and a fourth sampling voltage corresponding to the fourth voltage sampling circuit, and determine the second impedance based on the fourth sampling voltage, the sixth sampling voltage, a third resistance of the third voltage adjustment circuit, and a fourth resistance corresponding to the fourth voltage adjustment circuit.

In some embodiments, the second impedance is a sum of an impedance of the second winding, an impedance of the third switch element, and an impedance of the fourth switch element in the transformer input module under daisy-chain communication.

In a second aspect, a circuit fault early warning method applied to a cell sampling circuit is provided in the present application, the cell sampling circuit including: a plurality of target units sequentially connected in series in a daisy-chain communication manner, a transformer unit being connected between every two successive target units; wherein the target unit arranged at the first place in the series connection is a main control unit, the rest of the target units are all cell sampling units, and the method includes performing actions, for each of the target units, including acquiring an impedance of the transformer unit connected thereto, and judging, based on the acquired impedance, whether to perform a circuit abnormality early warning.

In a third aspect, a battery management system is provided in the present application, and the battery management system includes the cell sampling circuit according to any one of the first aspect.

In a fourth aspect, a battery is provided in the present application, and the battery includes the battery management system according to the third aspect.

In a fifth aspect, a powered device is provided in the present application, and the powered device includes the battery according to the fourth aspect.

In a sixth aspect, a computer-readable storage medium is provided in the present application, the storage medium includes a stored program, wherein the program, during running, controls a device where the storage medium is located to perform the circuit fault early warning method according to any one of the second aspect.

The above description is only an overview of the technical solutions of the embodiments of the present application. In order to understand the technical means of the embodiments of the present application more clearly, it can be implemented according to the contents of the specification, and specific embodiments of the present application are listed below in order to make the above and other objectives, features, and advantages of the embodiments of the present application more obvious and easier to understand.

DESCRIPTION OF DRAWINGS

Various other advantages and benefits will become apparent to those of ordinary skill in the art upon reading the following detailed description of some embodiments. The accompanying drawings are for purposes of illustrating some embodiments only and are not intended to be construed as limitation to the present application. Moreover, identical components are denoted by identical reference numerals throughout the accompanying drawings. In the accompanying drawings.

DETAILED DESCRIPTION

Figure 1:
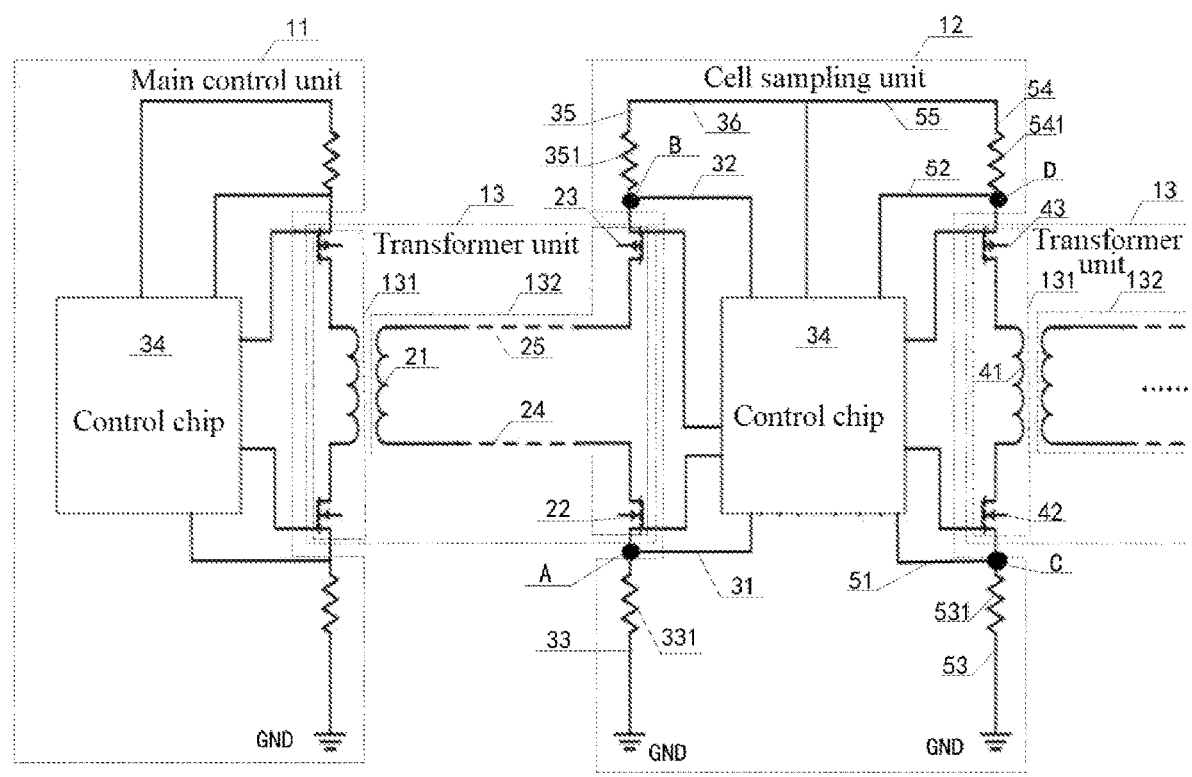
FIG. 1 is a schematic diagram of a cell sampling circuit according to some embodiments of the present application.

Embodiments of the technical solutions of the present application will be described in detail below with reference to the accompanying drawings. The following embodiments are only used for illustrating the technical solutions of the present application more clearly, and are therefore only used as examples, and cannot be used for limiting the protection scope of the present application.

Unless otherwise defined, all technical and scientific terms used herein have the same meanings as commonly understood by those of ordinary skill in the art of this application. The terms used herein are for the purpose of describing specific embodiments only, and are not intended to limit the present application. The terms "including," "having" and any variations thereof in the specification and claims of the present application and the above brief description of the accompanying drawings are intended to cover non-exclusive inclusion.

In the description of the embodiments of the present application, technical terms such as "first" and "second" are only used for distinguishing different objects, and should not be understood as indicating or implying relative importance or implying the quantity, particular sequence, or primary and secondary relationship of indicated technical features. In the description of the embodiments of the present application, "a plurality of" means two or more, unless otherwise expressly and specifically defined.

Reference herein to an "embodiment" means that a particular feature, structure, or characteristic described with reference to the embodiment can be included in at least one embodiment of the present application. The appearances of the phrase in various places in the specification are not necessarily all referring to the same embodiment, nor a separate or alternative embodiment that is mutually exclusive of another embodiment. It is explicitly and implicitly understood by those skilled in the art that the embodiments described herein may be combined with another embodiment.

In the description of the embodiments of the present application, the term "and/or" is only an association relationship for describing associated objects, indicating that there may be three types of relationships. For example, A and/or B may indicate three cases including: A exists, both A and B exist, and B exists. In addition, the character "/" herein generally indicates that the associated objects before and after the character are in an "or" relationship.

In the description of the embodiments of the present application, the term "a plurality of" refers to two or more (including two), similarly, "a plurality of groups" refers to two or more groups (including two groups), and "a plurality of pieces" refers to of two or more pieces (including two pieces).

In the description of the embodiments of the present application, orientations or positional relationships indicated by technical terms such as "center," "longitudinal," "lateral," "length," "width," "thickness," "upper," "lower," "front," "rear," "left," "right," "vertical" "horizontal," "top," "bottom," "inside," "outside," "clockwise," "counterclockwise," "axial," "radial," and "circumferential" are based on orientations or positional relationships shown in the accompanying drawings, are only for the convenience of describing the embodiments of the present application and simplifying the description, rather than indicating or implying that the indicated apparatus or element must have a specific orientation or be constructed and operated in a specific orientation, and therefore cannot be understood as limitation to the embodiments of the present application.

In the description of the embodiments of the present application, unless otherwise expressly specified and limited, technical terms such as "installation," "connected," "connection," and "fixed" should be understood in a broad sense, for example, it may be a fixed connection, a detachable connection, or an integral connection; it may also be a mechanical connection or an electrical connection; it may be a direct connection or an indirect connection through an intermediate medium, and it may be an internal communication between two elements or an interaction relationship between the two elements. Those of ordinary skill in the art can understand specific meanings of the above terms in the embodiments of the present application according to specific situations.

A battery pack is usually composed of a plurality of cells connection in series and parallel, and states of the cells directly affect the safety of the battery. When abnormal conditions such as short circuit, overcharge, overdischarge, and poor voltage consistency occur in the cells, the battery performance of the battery pack will be degraded and the life of the battery pack will be attenuated. Seriously, it will cause smoke, fire, explosion, and the like of the battery pack, which will seriously endanger the safe use of the battery pack. Therefore, in order to ensure the safety of the battery pack, it is necessary to detect state data such as voltage and temperature of various cells in the battery pack in real time during the use of the battery pack, so as to accurately control and protect charging and discharging processes of the battery pack based on the state data.

At present, a battery management system collects state data of cells by a cell sampling circuit. The current cell sampling circuit mostly adopts a distributed solution. A plurality of cell sampling units in the cell sampling circuit are responsible for the collection of the state data of the cells, and the main control unit in the cell sampling circuit is responsible for performing processing and control according to state parameters collected by the cell sampling units. Once a fault occurs in the actual use of the cell sampling circuit, the communication of the cell sampling circuit will be interrupted, and the state data of cells such as voltage and temperature will be unable to be collected due to the communication interruption. In a where that the state data of the cells cannot be collected, in order to ensure the safety of the battery pack, a high-voltage circuit of the battery pack will be quickly disconnected to ensure that the battery pack is in a safe state. Although this method ensures the safety of the battery pack, it causes inconvenience for a user to use the battery pack and affects the user experience.

The applicant has noticed that the main reason for the fault of the cell sampling circuit is a fault of the transformer unit in the cell sampling circuit. The transformer unit is mainly configured to achieve electrical isolation between components in the cell sampling circuit. Limited by the manufacturing process of the transformer unit, faults such as transformer disconnection often occur during the actual use of the cell sampling circuit. The fault of the transformer will cause the communication of the cell sampling circuit to be interrupted, and the state data such as the voltage and temperature of the cells cannot be collected. At present, the occurrence of the transformer fault is only detected after the battery pack enters a safe state, and the battery pack entering the safe state will directly prevent the user from using the battery pack, causing inconvenience to the user when using the battery pack.

In order to discover the abnormality of the transformer unit in time before the communication of the cell sampling circuit is interrupted, the applicant has found that a cell sampling circuit can be designed so that before an abnormality occurs in the transformer unit, and the abnormality does not cause the communication of the cell sampling circuit to be interrupted, the circuit abnormality is warned in advance to give the user a circuit abnormality early warning, so that the user can handle the abnormality based on the early warning in advance.

Based on the above consideration, a cell sampling circuit is designed by the applicant after in-depth study. Specifically, the cell sampling circuit includes: a plurality of target units sequentially connected in series in a daisy-chain communication manner, a transformer unit being connected between every two successive target units; wherein the target unit arranged at the first place in the series connection is a main control unit, and the rest of the target units are all cell sampling units; each of the target units is configured to acquire an impedance of the transformer unit connected thereto, and judge, based on the acquired impedance, whether to perform a circuit abnormality early warning.

A battery management system provided with a cell sampling circuit is disclosed in an embodiment of the present application, so that the battery management system performs battery control and association based on data collected by the cell sampling circuit.

The battery provided with the battery management system disclosed in the embodiments of the present application can be used in, but not limited to, powered devices such as vehicles, ships, or aircraft. A power supply system for the powered device may be formed by using the battery and the like disclosed in the present application. In this way, before the transformer of the cell sampling circuit is abnormal, and the abnormality has not caused the communication of the cell sampling circuit to be interrupted, the abnormality of the circuit can be warned in advance to avoid a circuit abnormality early warning is given to the user, so that the user can handle the abnormality based on the warning in advance.

a powered device using a battery as a power supply is provided in the embodiment of the present application, and the powered device may be, but is not limited to, a mobile phone, a tablet, a laptop, an electric toy, an electric tool, an electric bicycle, an electric vehicle, a ship, a spacecraft, and the like. The electric toy may include a stationary or mobile electric toy, such as a game console, an electric car toy, an electric ship toy, and an electric airplane toy, and the spacecraft may include an airplane, a rocket, a space shuttle, a spaceship, and the like.

As shown in FIG. 1, a cell sampling circuit is provided in an embodiment of the present application. The cell sampling circuit includes: a plurality of target units sequentially connected in series in a daisy-chain communication manner, wherein the target unit arranged at the first place in the series connection is main control unit 11, and the rest of the target units are all cell sampling units 12; and transformer unit 13 is connected between every two successive target units. Each of the target units is respectively configured to acquire an impedance of transformer unit 13 connected thereto, and judge, based on the acquired impedance, whether to perform a circuit abnormality early warning.

Main control unit 11 and at least one cell sampling unit 12 are both target units, which are sequentially connected in series in the daisy-chain communication manner. Main control unit 11 arranged at the first place in the series connection. As shown in FIG. 1, only two target units among the plurality of target units connected in series are shown in FIG. 1, and the rest of the target units are not shown. The target unit arranged at the first place is main control unit 11. The other target units are all cell sampling units 12 and are connected in series behind main control unit 11. The daisy-chain communication manner is adopted between the target units, and therefore, transformer unit 13 is connected between every two successive target units, so as to realize electrical isolation between the target units by using transformer unit 13.

The main reason for the fault of the cell sampling circuit is a fault of transformer unit 13 in the cell sampling circuit. Therefore, it is necessary to monitor transformer unit 13, so as to detect the abnormality in time and give an early warning of the abnormality of the circuit when there is an abnormality but no fault occurs.

The fault of transformer unit 13 is mainly a disconnection fault. The disconnection fault is usually caused by excessive pulling up of a winding of the transformer when the transformer structure expands or contracts due temperature changes. The winding is pulled up excessively when the transformer structure expands or contracts, which will inevitably cause an impedance of transformer unit 13 to increase. Therefore, by acquiring the impedance of transformer unit 13, it can be determined whether to perform a circuit abnormality early warning.

The job of acquiring the impedance of transformer unit 13 is done by the target unit. Each of the target units is respectively configured to acquire the impedance of transformer unit 13 connected thereto. The impedance acquired by the target unit can reflect a situation that the winding of transformer unit 13 connected thereto is excessively pulled up, which can reflect the risk of disconnection of the winding of transformer unit 13. Therefore, the target unit can judge, based on the acquired impedance of transformer unit 13 connected thereto, whether to perform a circuit abnormality early warning. Once the target unit determines, based on the acquired impedance, that there is a risk of disconnection in the cell sampling circuit, a circuit abnormality early warning is issued, so that the user can handle the warning in time.

The cell sampling circuit provided by the embodiment of the present application includes a plurality of target units sequentially connected in series in a daisy-chain communication manner, wherein the target unit arranged at the first place in the series connection is the main control unit, and the rest of the target units are the cells sampling units. A transformer unit is connected between every two successive target units. Each of the target units is configured to acquire an impedance of the transformer unit connected thereto, and judge, based on the acquired impedance, whether to perform a circuit abnormality early warning. The impedance acquired by the target unit can reflect a situation that a winding of the transformer unit connected thereto is excessively pulled up, and can reflect the magnitude of a risk of disconnection of the winding of the transformer unit. Therefore, in the solution provided by the embodiment of the present application, by the method of detecting the impedance of the transformer unit connected thereto, the target unit can detect an abnormal situation of the transformer unit in time, so that when the transformer unit is abnormal and no disconnection fault has occurred yet, a circuit abnormality early warning is provided, so that the user handles the circuit abnormality in advance according to the circuit abnormality early warning.

According to some embodiments of the present application, optionally, the target unit located upstream of the two successive target units is connected to transformer input module 131 of transformer unit 13, and the target unit located downstream is connected to transformer output module 132 of transformer unit 13. Each of the target units is configured to acquire an impedance of the target module connected thereto, and judge, based on the acquired impedance, whether to perform a circuit abnormality early warning, wherein the target module is determined based on a connection relationship between the target unit and transformer unit 13.

Transformer unit 13 includes transformer input module 131 and transformer output module 132. The target unit located upstream of the two successive target units is connected to transformer input module 131 of transformer unit 13, and the target unit located downstream is connected to transformer output module 132 of transformer unit 13. The upstream and the downstream are determined based on a communication direction between main control unit 11 and each cell sampling unit 12, and the communication direction from main control unit 11 to the last cell sampling unit 12 is defined as from upstream to downstream.

As can be seen from FIG. 1, in a case where one of the two successive target units is main control unit 11 and the other target unit is cell sampling unit 12, main control unit 11 is the target unit located upstream, and cell sampling unit 12 is the target unit located downstream. When two successive target units are both cell sampling units 12, cell sampling unit 12 close to main control unit 11 is the target unit located upstream, and the other cell sampling unit 12 is the target unit located upstream.

In order to detect the abnormality of transformer unit 13 in time, each target unit needs to acquire the impedance of transformer unit 13 connected thereto. When each target unit acquires the impedance, it only acquires the impedance of the target module connected thereto. For a target unit, its corresponding target module is determined based on its connection relationship with transformer unit 13.

When the target unit is main control unit 11, since only one side of the target unit is connected to transformer unit 13, the target module connected thereto includes transformer input module 131 connected thereto. Exemplarily, as can be seen from FIG. 1, the target unit is main control unit 11, and the target module is transformer input module 131 in transformer unit 13 connected thereto. Main control unit 11 can monitor the abnormality of transformer unit 13 by acquiring the impedance of transformer input module 131 connected thereto.

When the target unit is cell sampling unit 12, since both side of the target unit are connected to transformer unit 13, the target module connected thereto includes transformer output module 132 connected thereto and transformer input module 131 connected thereto. Exemplarily, as can be seen from FIG. 1, the target unit is cell sampling unit 12 adjacent to main control unit 11. Both sides of cell sampling unit 12 is connected to transformer unit 13, so there are two target modules connected to: one is transformer output module 132 in transformer unit 13 connected upstream thereto, and the other is transformer input module 131 in transformer unit 13 connected downstream thereto.

According to some embodiments of the present application, optionally, when the target unit is cell sampling unit 12, the target module connected thereto includes transformer output module 132 connected thereto and transformer input module 131 connected thereto, and the acquired impedance includes a first impedance and a second impedance. The first impedance is the impedance of transformer output module 132 connected thereto, and the second impedance is the impedance of transformer input module 131 connected thereto.

As shown in FIG. 1, both sides of cell sampling unit 12 are connected to transformer units 13, and therefore, it can monitor conditions of two transformer units 13 at the same time. Therefore, cell sampling unit 12 needs to acquire the first impedance of transformer output module 132 connected thereto and the second impedance of transformer input module 131 connected thereto.

The first impedance can reflect a situation that the winding of transformer output module 132 in transformer unit 13 is excessively pulled up, and can reflect the risk of disconnection of the winding of transformer output module 132. The second impedance can reflect a situation that the winding of transformer input module 131 in transformer unit 13 is excessively pulled up, and can reflect the risk of disconnection of the winding of transformer input module 131. Therefore, cell sampling unit 12 can determine the disconnection risk of the winding of transformer output module 132 connected thereto according to the magnitude of the first impedance collected, and issue a circuit abnormality early warning when the risk is determined to be high, so as to provide a circuit abnormality early warning when an abnormality occurs in the transformer unit and a disconnection fault has not yet occurred, so that the user can handle the circuit abnormality in advance according to the circuit abnormality early warning. Likewise, cell sampling unit 12 can determine the disconnection risk of the winding of transformer input module 131 connected thereto according to the magnitude of the second impedance collected, and issue a circuit abnormality early warning when the risk is determined to be high, so as to provide a circuit abnormality early warning when an abnormality occurs in the transformer unit and a disconnection fault has not yet occurred, so that the user can handle the circuit abnormality in advance according to the circuit abnormality early warning.

According to some embodiments of the present application, optionally, when the target unit is main control unit 11, the target module connected thereto includes transformer input module 131 connected thereto, the acquired impedance is a second impedance, and the second impedance is the impedance of transformer input module 131 connected thereto.

As shown in FIG. 1, one side of main control unit 11 is connected to transformer unit 13, which can monitor the condition of transformer unit 13 connected thereto. Therefore, main control unit 11 needs to acquire the second impedance of transformer input module 131 connected thereto.

The second impedance can reflect a situation that the winding of transformer input module 131 in transformer unit 13 is excessively pulled up, and can reflect the risk of disconnection of the winding of transformer input module 131. Main control unit 11 can determine the disconnection risk of the winding of transformer input module 131 connected thereto according to the magnitude of the second impedance collected, and issue a circuit abnormality early warning when the risk is determined to be high, so as to provide a circuit abnormality early warning when an abnormality occurs in the transformer unit and a disconnection fault has not yet occurred, so that the user can handle the circuit abnormality in advance according to the circuit abnormality early warning.

According to some embodiments of the present application, optionally, each of the target units is configured to perform a circuit abnormality early warning when it is determined that the acquired impedance of the target module reaches an impedance threshold corresponding to the target module.

For a target unit, the connected target modules have their respective corresponding impedance thresholds.

For a target module, the impedance threshold is an upper limit of the impedance of the winding of the target module. Once the impedance of the target module reaches the impedance threshold, the possibility of disconnection thereof increases. Therefore, after acquiring the impedance of the target module, the target unit needs to compare the acquired impedance of the target module with the impedance threshold corresponding to the target module.

When the target unit determines that the acquired impedance of the target module reaches the impedance threshold corresponding to the target module, it indicates that the stretching of the winding of the target module has caused a high risk of disconnection. Therefore, it is necessary to carry out a circuit abnormality early warning for the target module, so that the user handles the early warning of the risk of disconnection of the cell sampling circuit.

When the target unit determines that the acquired impedance of the target module does not reach the impedance threshold corresponding to the target module, it indicates that the stretching of the winding of the target module has not caused a greater risk of disconnection, and there is no need to perform a circuit abnormality early warning for the target module.

It should be noted that, when the target unit is main control unit 11, if it is determined that a circuit abnormality early warning needs to be performed, it can directly perform the early warning processing. If the target unit is cell sampling unit 12, in order to reduce the processing volume of cell sampling unit 12, when cell sampling unit 12 determines that a circuit abnormality early warning needs to be performed, it may transmit the requirement for the circuit abnormality early warning to main control unit 11 by the daisy-chain communication, and main control unit 11 performs the circuit abnormality early warning processing thereof.

According to some embodiments of the present application, optionally, each of the target units is configured to determine an abnormal transformer unit, and issue a circuit abnormality early warning for the abnormal transformer unit, wherein the abnormal transformer unit is transformer unit 13 to which the target module whose impedance reaches the corresponding impedance threshold belongs.

In order to achieve accurate positioning of faulty transformer unit 13, facilitate maintenance, and reduce maintenance time, the target unit determines the abnormal transformer unit when it is determined that the acquired impedance of the target module reaches the impedance threshold value corresponding to the target module, and issues a circuit abnormality early warning for the abnormal transformer unit.

The abnormal transformer unit is transformer unit 13 to which the target module whose impedance reaches the corresponding impedance threshold belongs. In other words, when the abnormal transformer unit expands or contracts due to the temperature change of the transformer structure, the winding of the target module is excessively pulled up, and there is a risk of disconnection. In order to realize the precise location of faulty transformer unit 13, a circuit abnormality early warning is issued for the abnormal transformer unit, so that the maintenance personnel can accurately know which transformer unit 13 has the risk of disconnection, so that it can be quickly and targeted for repairing and replacement, thereby improving the repairing efficiency.

According to some embodiments of the present application, optionally, as shown in FIG. 1, transformer output module 132 includes: first winding 21, first switch element 22, second switch element 23, first connection circuit 24, and second connection circuit 25. A first end of first winding 21 is connected to a first end of first switch element 22 through first connection circuit 24, and a second end is connected to a first end of second switch element 23 through second connection circuit 25; and a second end of first switch element 22 and a second end of second switch element 23 are respectively connected to cell sampling unit 12.

First winding 21, first switch element 22, second switch element 23, first connection circuit 24, and second connection circuit 25 constitute transformer output module 132. First winding 21, first connection circuit 24, and second connection circuit 25 will all be excessively stretched during the use of the cell sampling circuit, and there is a risk of disconnection. The excessively stretching described here is caused by the expansion or contraction of the transformer structure due to the temperature change during the use of the cell sampling circuit.

A first impedance Rn corresponding to transformer output module 132 is a sum of impedance Rt1 of first winding 21, impedance Rmos of first switch element 22, impedance Rmos of second switch element 23, impedance Rj1 of first connection circuit 24, and impedance Rj2 of second connection circuit 25 in transformer output module 132, that is, Rn=Rj2+Rt1+Rj1+2Rmos. In a scenario of the expansion or contraction of the transformer structure caused by the temperature change, first winding 21, first connection circuit 24, and second connection circuit 25 may all be excessively stretched, and there is a risk of disconnection. After first winding 21, first connection circuit 24, and second connection circuit 25 are stretched, their respective impedances will increase. Therefore, first impedance Rn can reflect whether there is a risk of disconnection in first winding 21, first connection circuit 24, and second connection circuit 25, and can be used as a judgment basis for the circuit abnormality early warning.

According to some embodiments of the present application, optionally, as shown in FIG. 1, cell sampling unit 12 includes: first voltage sampling circuit 31, second voltage sampling circuit 32, first voltage adjustment circuit 33, and control chip 34. A first end of first voltage adjustment circuit 33 is connected to first node A, and a second end is connected to ground wire GND. A first end of first voltage sampling circuit 31 is connected to first node A, and a second end is connected to a first pin of control chip 34. A first end of second voltage sampling circuit 32 is connected to second node B, and a second end is connected to a second pin of control chip 34. First node A is connected to the second end of first switch element 22, and is connected to a third pin of control chip 34. Second node B is connected to the second end of second switch element 23, and is connected to a fourth pin of control chip 34.

Control chip 34 is configured to acquire the first impedance Rn of transformer output module 132 connected thereto. First voltage sampling circuit 31, second voltage sampling circuit 32, and first voltage adjustment circuit 33 are all configured to assist control chip 34 to acquire first impedance Rn. The magnitude of the impedance of transformer output module 132 will cause a voltage change in second voltage sampling circuit 32. First voltage adjustment circuit 33 includes voltage adjusting resistor 331 configured to adjust the voltage.

According to some embodiments of the present application, optionally, as shown in FIG. 1, control chip 34 is configured to collect first sampling voltage U1 corresponding to first voltage sampling circuit 31 and second sampling voltage U2 corresponding to second voltage sampling circuit 32, and determine first impedance Rn based on first sampling voltage U1, second sampling voltage U2, and first resistance R1 of first voltage adjustment circuit 33.

When first impedance Rn is determined, the following formula is established based on the principle of equal current:

$$\frac{U1}{R1} = \frac{U2}{R1 + Rn};$$

Since both first sampling voltage U1 and second sampling voltage U2 in the above formula can be collected, and first resistance R1 is known in advance, first impedance Rn can be determined by the above formula.

According to some embodiments of the present application, optionally, as shown in FIG. 1, cell sampling unit 12 further includes: second voltage adjustment circuit 35 and third voltage sampling circuit 36. First end of second voltage adjustment circuit 35 is connected to second node B, and a second end is connected to a first end of third voltage sampling circuit 36; and a second end of third voltage sampling circuit 36 is connected to a fifth pin of control chip 34.

Both second voltage adjustment circuit 35 and third voltage sampling circuit 36 are both configured to assist control chip 34 to acquire first impedance Rn. Second voltage adjustment circuit 35 includes voltage adjusting resistor 351 configured to adjust the voltage. The magnitude of the impedance of transformer output module 132 will cause a voltage change in third voltage sampling circuit 36.

According to some embodiments of the present application, optionally, as shown in FIG. 1, control chip 34 is configured to collect second sampling voltage U2 corresponding to second voltage sampling circuit 32 and third sampling voltage U3 corresponding to third voltage sampling circuit 36, and determine first impedance Rn based on second sampling voltage U2, third sampling voltage U3, first resistance R1 of first voltage adjustment circuit 33, and second resistance R2 of second voltage adjustment circuit 35.

When first impedance Rn is determined, the following formula is established based on the principle of equal current:

$$\frac{U3}{R1 + R2 + Rn} = \frac{U2}{R1 + Rn};$$

Since both third sampling voltage U3 and second sampling voltage U2 in the above formula can be collected, and first resistance R1 and second resistance R2 are known in advance, first impedance Rn can be determined by the above formula.

According to some embodiments of the present application, optionally, as shown in FIG. 1, control chip 34 is configured to collect first sampling voltage U1 corresponding to first voltage sampling circuit 31 and third sampling voltage U3 corresponding to third voltage sampling circuit 36, and determine first impedance Rn based on first sampling voltage U1, third sampling voltage U3, first resistance R1 of first voltage adjustment circuit 33, and second resistance R2 of second voltage adjustment circuit 35.

When first impedance Rn is determined, the following formula is established based on the principle of equal current:

$$\frac{U3}{R1 + R2 + Rn} = \frac{U1}{R1};$$

Since both third sampling voltage U3 and first sampling voltage U1 in the above formula can be collected, and first resistance R1 and second resistance R2 are known in advance, first impedance Rn can be determined by the above formula.

According to some embodiments of the present application, optionally, as shown in FIG. 1, the first impedance is a sum of the impedance of first winding 21, the impedance of first switch element 22, the impedance of second switch element 23, the impedance of first connection circuit 24, and the impedance of second connection circuit 25 in transformer output module 132 under daisy-chain communication.

First impedance Rn corresponding to transformer output module 132 is a sum of the impedance of first winding 21, the impedance of first switch element 22, the impedance of second switch element 23, the impedance of first connection circuit 24, and the impedance of second connection circuit 25 in transformer output module 132. After first winding 21, first connection circuit 24, and second connection circuit 25 are stretched, their respective impedances will increase. Therefore, first impedance Rn can reflect whether there is a risk of disconnection in first winding 21, first connection circuit 24, and second connection circuit 25, and can be used as a judgment basis for the circuit abnormality early warning.

According to some embodiments of the present application, optionally, as shown in FIG. 1, transformer input module 131 includes: second winding 41, third switch element 42, and fourth switch element 43. A first end of second winding 41 is connected to a first end of third switch element 42, and a second end is connected to fourth switch element 43. A second end of third switch element 42 and a second end of fourth switch element 43 are respectively connected to the target unit.

It should be noted that, in the cell sampling circuit, both main control unit 11 and cell sampling unit 12 need their corresponding transformer input modules 131, and therefore, the target unit connected to the second end of third switch element 42 and the second end of fourth switch element 43, in a specific connection scenario, is main control unit 11 or cell sampling unit 12. Specific description is shown in FIG. 1.

Second winding 41, third switch element 42, and fourth switch element 43 constitute transformer input module 131. Second winding 41 will be excessively stretched during the use of the cell sampling circuit, and there is a risk of disconnection. The excessively stretching described here is caused by the expansion or contraction of the transformer structure due to the temperature change during the use of the cell sampling circuit.

Second impedance Rm corresponding to transformer input module 131 is a sum of impedance Rt2 of second winding 41, impedance Rmos of third switch element 42, and impedance Rmos of fourth switch element 43 in transformer input module 131, that is, Rm=Rt2+2Rmos. After second winding 41 is stretched, its corresponding impedance will increase. Therefore, second impedance Rm can reflect whether there is a risk of disconnection of second winding 41, and can be used as a judgment basis for circuit abnormality early warning.

According to some embodiments of the present application, optionally, as shown in FIG. 1, the target unit includes: fourth voltage sampling circuit 51, fifth voltage sampling circuit 52, third voltage adjustment circuit 53, and control chip 34. A first end of third voltage adjustment circuit 53 is connected to third node C, and a second end is connected to ground wire GND. A first end of fourth voltage sampling circuit 51 is connected to third node C, and a second end is connected to a sixth pin of control chip 54. A first end of fifth voltage sampling circuit 52 is connected to fourth node D, and a second end is connected to a seventh pin of control chip 34. Third node C is connected to the second end of third switch element 42, and is connected to an eighth pin of control chip 34. Fourth node D is connected to the second end of fourth switch element 43, and is connected to a ninth pin of control chip 34.

The target unit described here includes main control unit 11 and cell sampling unit 12. Control chip 34 included in the target unit has the same function in main control unit 11 and cell sampling unit 12, that is, acquiring second impedance Rm of first transformer input module 131, and judging, based on second impedance Rm, whether to perform a circuit abnormality early warning. However, they also have different functions. For example, the main control chip in the main control unit is configured to perform battery management based on voltage state data collected by cell sampling unit 12, and cell sampling unit 12 is configured to collect the state data of the cell.

Control chip 34 is configured to acquire second impedance Rm of transformer input module 131 connected thereto. Fourth voltage sampling circuit 51, fifth voltage sampling circuit 52, and third voltage adjustment circuit 53 are all configured to assist control chip 34 to acquire second impedance Rm. The magnitude of the impedance of transformer input module 131 will cause voltage changes in fourth voltage sampling circuit 51 and fifth voltage sampling circuit 52. Third voltage adjustment circuit 53 includes voltage adjusting resistor 531 configured to adjust the voltage.

According to some embodiments of the present application, optionally, control chip 54 is configured to collect fourth sampling voltage U4 corresponding to fourth voltage sampling circuit 51 and fifth sampling voltage U5 corresponding to fifth voltage sampling circuit 52, and determine second impedance Rm based on fourth sampling voltage U4, fifth sampling voltage U5, and third resistance R3 of third voltage adjustment circuit 53.

When second impedance Rm is determined, the following formula is established based on the principle of equal current:

$$\frac{U4}{R3} = \frac{U5}{R3 + Rm};$$

Since both fourth sampling voltage U4 and fifth sampling voltage U5 in the above formula can be collected, and third resistance R3 is known in advance, second impedance Rm can be determined by the above formula.

According to some embodiments of the present application, optionally, the target unit further includes: fourth voltage adjustment circuit 54 and sixth voltage sampling circuit 55. A first end of fourth voltage adjustment circuit 54 is connected to fourth node D, and a second end is connected to a first end of sixth voltage sampling circuit 55; and a second end of sixth voltage sampling circuit 55 is connected to a tenth pin of control chip 54.

Both fourth voltage adjustment circuit 54 and sixth voltage sampling circuit 55 are both configured to assist control chip 34 to acquire second impedance Rm. Fourth voltage adjustment circuit 54 includes voltage adjusting resistor 541 configured to adjust the voltage. The magnitude of the impedance of transformer input module 131 will cause a voltage change in sixth voltage sampling circuit 55.

According to some embodiments of the present application, optionally, control chip 54 is configured to collect sixth sampling voltage U6 corresponding to sixth voltage sampling circuit 55 and fifth sampling voltage U5 corresponding to fifth voltage sampling circuit 52, and determine second impedance Rm based on sixth sampling voltage U6, fifth sampling voltage U5, third resistance R3 of third voltage adjustment circuit 53, and fourth resistance R4 of fourth voltage adjustment circuit 54.

When second impedance Rm is determined, the following formula is established based on the principle of equal current:

$$\frac{U6}{R3 + R4 + Rm} = \frac{U5}{R3 + Rm};$$

Since both sixth sampling voltage U6 and fifth sampling voltage U5 in the above formula can be collected, and third resistance R3 and fourth resistance R4 are known in advance, second impedance Rm can be determined by the above formula.

According to some embodiments of the present application, optionally, control chip 54 is configured to collect sixth sampling voltage U6 corresponding to sixth voltage sampling circuit 55 and fourth sampling voltage U4 corresponding to fourth voltage sampling circuit 51, and determine second impedance Rm based on fourth sampling voltage U4, sixth sampling voltage U6, third resistance R3 of third voltage adjustment circuit 53, and fourth resistance R4 of fourth voltage adjustment circuit 54.

When second impedance Rm is determined, the following formula is established based on the principle of equal current:

$$\frac{U6}{R3+R4+Rm} = \frac{U4}{R3};$$

Since both fourth sampling voltage U4 and sixth sampling voltage U6 in the above formula can be collected, and third resistance R3 and fourth resistance R4 are known in advance, second impedance Rm can be determined by the above formula.

According to some embodiments of the present application, optionally, second impedance Rm is a sum of the impedance of second winding 41, the impedance of third switch element 42, and the impedance of fourth switch element 43 in transformer input module 131 under daisy-chain communication.

Second impedance Rm corresponding to transformer input module 131 is a sum of the impedance of second winding 41, the impedance of third switch element 42, and the impedance of fourth switch element 43 in transformer input module 131. After second winding 41 is stretched, its corresponding impedance will increase. Therefore, second impedance Rm can reflect whether there is a risk of disconnection of second winding 41, and can be used as a judgment basis for circuit abnormality early warning.

Figure 2:
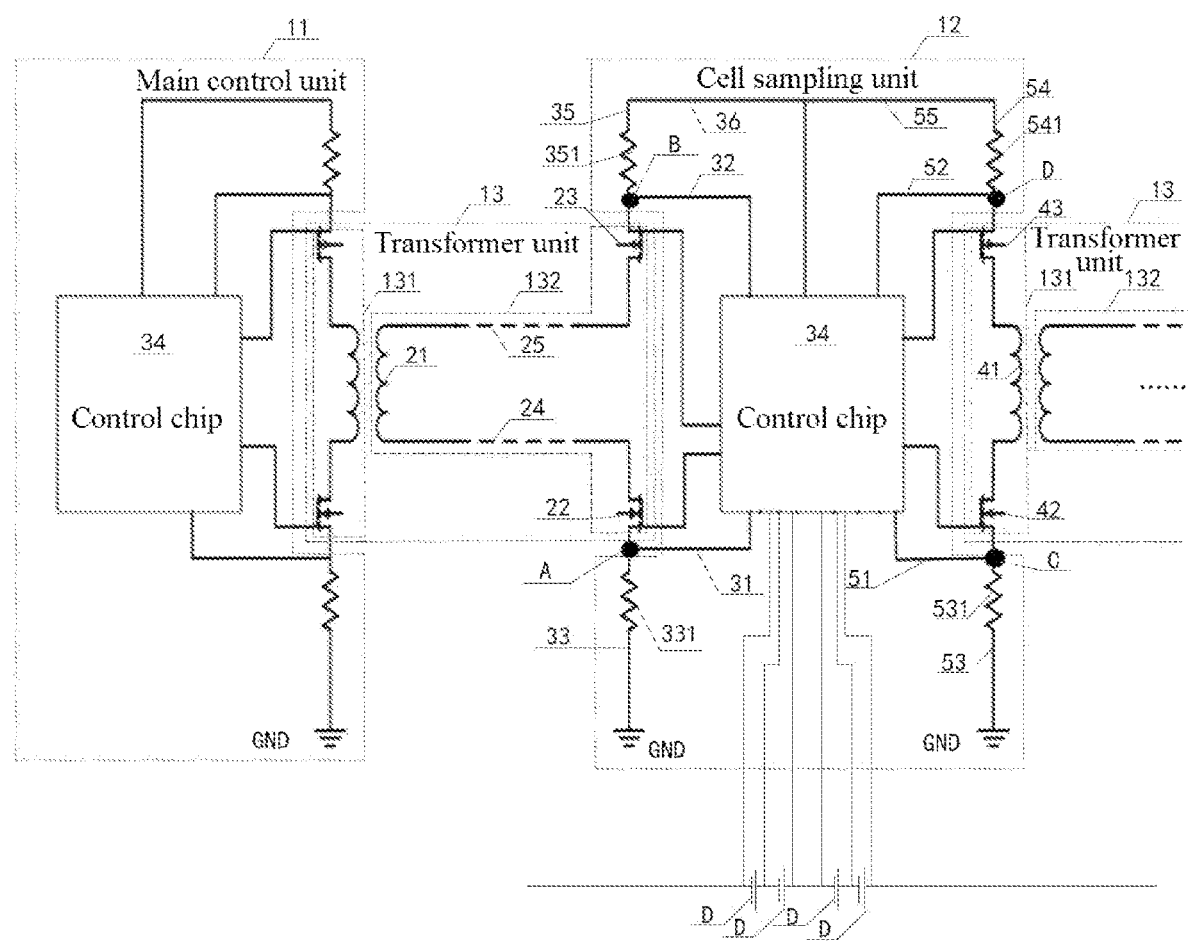
FIG. 2 is a schematic diagram of a connection relationship between a cell sampling circuit and a cell according to some embodiments of the present application.

According to some embodiments of the present application, optionally, as shown in FIG. 2, each cell sampling unit 12 in the cell sampling circuit has at least one corresponding cell D, and is connected to corresponding cell D through a line, and configured to collect state data such as voltage and temperature of corresponding battery cell D, and transmit the state data to main control unit 11. Main control unit 11 is configured to perform battery management based on the voltage state data collected by cell sampling unit 12.

The cell sampling circuit shown in FIG. 2 can not only monitor the state of the cells in the battery pack in real time, but also the main control unit and the cell sampling unit can discover an abnormal situation of the transformer unit by detecting the impedance of the transformer unit connected thereto in time. Therefore, when the transformer unit is abnormal and the disconnection fault has not yet occurred, a circuit abnormality early warning is given, so that the user can handle the circuit abnormality in advance according to the circuit abnormality early warning.

Figure 3:
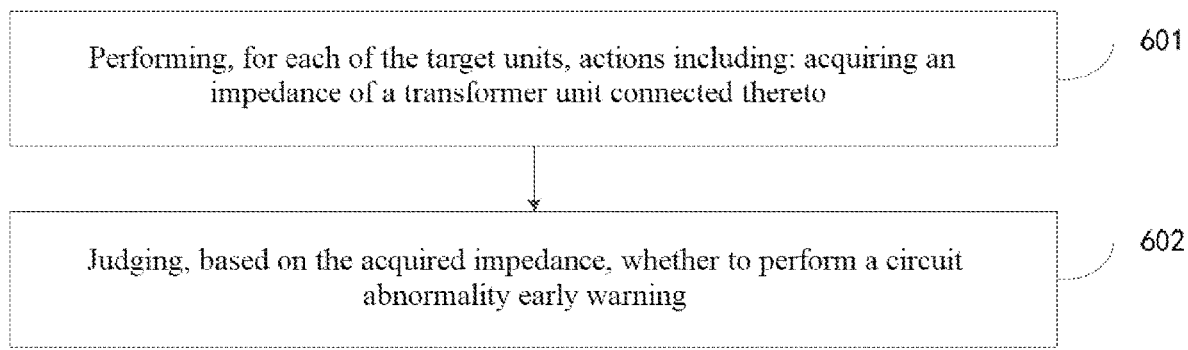
FIG. 3 is a flow chart of a circuit fault early warning method according to some embodiments of the present application.

Further, a circuit fault early warning method is further provided in another embodiment of the present application, which is applied to a cell sampling circuit as shown in FIG. 3. The cell sampling circuit includes a plurality of target units sequentially connected in series in a daisy-chain communication manner, a transformer unit is connected between every two successive target units, the target unit arranged at the first place in the series connection is a main control unit, and the rest of the target units are all cell sampling units; and the method mainly includes:

601. performing, for each of the target units, actions including acquiring an impedance of a transformer unit connected thereto; and

602. judging, based on the acquired impedance, whether to perform a circuit abnormality early warning.

The circuit fault early warning method provided by the embodiment of the present application is applied to the cell sampling circuit, and an abnormal situation of the transformer unit can be discovered in time by detecting the impedance of the transformer unit connected to the target units. Therefore, when the transformer unit is abnormal and the disconnection fault has not yet occurred, a circuit abnormality early warning is given, so that the user can handle the circuit abnormality in advance according to the circuit abnormality early warning.

Further, according to the above method embodiment, a battery management system is further provided in another embodiment of the present application, and the battery management system includes the cell sampling circuit as described above.

The cell sampling circuit included in the battery management system provided by the embodiment of the present application can discover the abnormal situation of the transformer unit in time by detecting the impedance of the transformer unit connected to each target unit, so that the abnormality occurs in the transformer unit and has not yet occurred. When there is a disconnection fault, a circuit abnormality early warning is given, so that the user can handle the circuit abnormality in advance according to the circuit abnormality early warning.

Further, according to the above method embodiment, a battery is further provided in another embodiment of the present application, and the battery includes the battery management system as described above.

Further, according to the above method embodiment, a powered device is further provided in another embodiment of the present application, and the powered device includes the battery as described above.

Further, according to the above method embodiment, a computer-readable storage medium is further provided in another embodiment of the present application, wherein the storage medium includes a stored program, and the program, during running, controls a device where the storage medium is located to perform the circuit fault early warning method described above.

In the above embodiments, the description of each embodiment has its own emphasis. For parts that are not described in detail in a certain embodiment, reference may be made to the relevant descriptions of other embodiments.

It is understandable that the relevant features in the above method and apparatus may refer to each other. In addition, "first," "second," and the like in the above embodiments are used for distinguishing the embodiments, and do not represent the advantages and disadvantages of the embodiments.

Those skilled in the art can clearly understand that, for the convenience and brevity of description, the specific working process of the system, apparatus, and unit described above may be obtained with reference to the corresponding process in the foregoing method embodiments, which will not be repeated here.

Finally, it should be noted that the above embodiments are only used for illustrating the technical solutions of the present application, but not to limit them; although the present application has been described in detail with reference to the foregoing embodiments, those of ordinary skill in the art should understand that: the technical solutions described in the foregoing embodiments can still be modified, or some or all of the technical features thereof can be equivalently replaced; and these modifications or replacements do not make the essence of the corresponding technical solutions deviate from the scope of the technical solutions of the embodiments of the present application, which shall be included in the scope of the claims and description of the present application. In particular, as long as there is no structural conflict, various technical features mentioned in the embodiments can be combined in any manner. The present application is not limited to the specific embodiments disclosed herein, but includes all technical solutions falling within the scope of the claims.

The invention claimed is:

1. A cell sampling circuit, comprising:
a plurality of target units sequentially connected in a series connection in a daisy-chain communication manner, one of the plurality of target units arranged at a first place in the series connection being a main control unit, and the other of the plurality of target units being cell sampling units; and
one or more transformer units each connected between two successive target units of the plurality of target units;
wherein each of the target units is configured to:
acquire an impedance of at least one transformer unit connected to the target unit; and
judge, based on the acquired impedance, whether to perform circuit abnormality early warning.

2. The cell sampling circuit according to claim 1, wherein:
for two successive target units connected to one transformer unit, an upstream one of the two successive target units is connected to a transformer input module of the one transformer unit, and a downstream one of the two successive target units is connected to a transformer output module of the transformer unit; and
each of the target units is configured to:
acquire an impedance of a target module connected to the target unit, the target module being determined based on a connection relationship between the target unit and the at least one transformer unit connected to the target unit; and
judge, based on the acquired impedance, whether to perform circuit abnormality early warning.

3. The cell sampling circuit according to claim 2, wherein for one of the cell sampling units, the target module comprises a transformer output module connected to the one of the cell sampling units and a transformer input module connected to the one of the cell sampling units, and the acquired impedance comprises an impedance of the transformer output module and an impedance of the transformer input module.

4. The cell sampling circuit according to claim 2, wherein for the main control unit, the target module comprises a transformer input module connected to the main control unit, and the acquired impedance comprises an impedance of the transformer input module.

5. The cell sampling circuit according to claim 2, wherein each of the target units is configured to perform circuit abnormality early warning in response to determining that the acquired impedance of the target module reaches an impedance threshold corresponding to the target module.

6. The cell sampling circuit according to claim 5, wherein each of the target units is configured to determine an abnormal transformer unit, and issue a circuit abnormality early warning for the abnormal transformer unit, the abnormal transformer unit being a transformer unit to which the target module having the impedance reaching the corresponding impedance threshold belongs.

7. The cell sampling circuit according to claim 2, wherein:
the transformer output module comprises: a winding, a first switch element, a second switch element, a first connection circuit, and a second connection circuit;
a first end of the winding is connected to a first end of the first switch element through the first connection circuit, and a second end of the winding is connected to a first end of the second switch element through the second connection circuit; and
a second end of the first switch element and a second end of the second switch element are connected to one target unit of the plurality of target units.

8. The cell sampling circuit according to claim 7, wherein:
the one target unit comprises: a first voltage sampling circuit, a second voltage sampling circuit, a voltage adjustment circuit, and a control chip;
a first end of the voltage adjustment circuit is connected to a first node, and a second end of the voltage adjustment circuit is connected to a ground wire;
a first end of the first voltage sampling circuit is connected to the first node, and a second end of the first voltage sampling circuit is connected to a first pin of the control chip;
a first end of the second voltage sampling circuit is connected to a second node, and a second end of the second voltage sampling circuit is connected to a second pin of the control chip;
the first node is connected to the second end of the first switch element, and is connected to a third pin of the control chip; and
the second node is connected to the second end of the second switch element, and is connected to a fourth pin of the control chip.

9. The cell sampling circuit according to claim 8, wherein the control chip is configured to collect a first sampling voltage corresponding to the first voltage sampling circuit and a second sampling voltage corresponding to the second voltage sampling circuit, and determine an impedance of the transformer output module connected to the one target unit based on the first sampling voltage, the second sampling voltage, and a resistance of the voltage adjustment circuit.

10. The cell sampling circuit according to claim 8, wherein:
the voltage adjustment circuit is a first voltage adjustment circuit;
the one target unit further comprises: a second voltage adjustment circuit and a third voltage sampling circuit;
a first end of the second voltage adjustment circuit is connected to the second node, and a second end of the second voltage adjustment circuit is connected to a first end of the third voltage sampling circuit; and
a second end of the third voltage sampling circuit is connected to a fifth pin of the control chip.

11. The cell sampling circuit according to claim 10, wherein:
the first voltage sampling circuit is configured to output a first sampling voltage, the second voltage sampling circuit is configured to output a second sampling voltage, and the third voltage sampling circuit is configured to output a third sampling voltage; and
the control chip is configured to:
collect the second sampling voltage corresponding to the second voltage sampling circuit and the third sampling voltage corresponding to the third voltage sampling circuit, and determine the impedance of the transformer output module connected to the one target unit based on the second sampling voltage, the third sampling voltage, a first resistance of the first voltage adjustment circuit, and a second resistance of the second voltage adjustment circuit; or collect the first sampling voltage corresponding to the first voltage sampling circuit and the third sampling voltage corresponding to the third voltage sampling circuit, and determine the impedance of the transformer output module connected to the one target unit based on the first sampling voltage, the third sampling voltage, the first resistance of the first voltage adjustment circuit, and the second resistance of the second voltage adjustment circuit.

12. The cell sampling circuit according to claim 7, wherein an impedance of the transformer output module is a sum of an impedance of the winding, an impedance of the first switch element, an impedance of the second switch element, an impedance of the first connection circuit, and an impedance of the second connection circuit of the transformer output module under daisy-chain communication.

13. The cell sampling circuit according to claim 2, wherein:
the transformer input module comprises: a winding, a first switch element, and a second switch element;
a first end of the winding is connected to a first end of the first switch element, and a second end of the winding is connected to a first end of the second switch element; and
a second end of the first switch element and a second end of the second switch element are connected to one target unit of the plurality of target units.

14. The cell sampling circuit according to claim 13, wherein:
the one target unit comprises: a first voltage sampling circuit, a second voltage sampling circuit, a voltage adjustment circuit, and a control chip;
a first end of the voltage adjustment circuit is connected to a first node, and a second end of the voltage adjustment circuit is connected to a ground wire;
a first end of the first voltage sampling circuit is connected to the first node, and a second end of the first voltage sampling circuit is connected to a first pin of the control chip;
a first end of the second voltage sampling circuit is connected to a second node, and a second end of the second voltage sampling circuit is connected to a second pin of the control chip;
the first node is connected to the second end of the first switch element, and is connected to a third pin of the control chip; and
the second node is connected to the second end of the second switch element, and is connected to a fourth pin of the control chip.

15. The cell sampling circuit according to claim 14, wherein the control chip is configured to collect a first sampling voltage corresponding to the first voltage sampling circuit and a second sampling voltage corresponding to the second voltage sampling circuit, and determine an impedance of the transformer input module connected to the one target unit based on the first sampling voltage, the second sampling voltage, and a resistance of the voltage adjustment circuit.

16. The cell sampling circuit according to claim 14, wherein:
the voltage adjustment circuit is a first voltage adjustment circuit;
the target unit further comprises: a second voltage adjustment circuit and a third voltage sampling circuit;
a first end of the second voltage adjustment circuit is connected to the second node, and a second end of the second voltage adjustment circuit is connected to a first end of the third voltage sampling circuit; and
a second end of the third voltage sampling circuit is connected to a fifth pin of the control chip.

17. The cell sampling circuit according to claim 16, wherein:
the first voltage sampling circuit is configured to output a first sampling voltage, the second voltage sampling circuit is configured to output a second sampling voltage, and the third voltage sampling circuit is configured to output a third sampling voltage; and
the control chip is configured to:
collect the third sampling voltage and one of the first sampling voltage and the second sampling voltage, and determine an impedance of the transformer input module connected to the one target unit based on the third sampling voltage, a first resistance of the first voltage adjustment circuit, a second resistance corresponding to the second voltage adjustment circuit, and the one of the first sampling voltage and the second sampling voltage.

18. The cell sampling circuit according to claim 13, wherein an impedance of the transformer input module is a sum of an impedance of the winding, an impedance of the first switch element, and an impedance of the second switch element of the transformer input module under daisy-chain communication.

19. A circuit fault early warning method, applied to a cell sampling circuit, wherein the cell sampling circuit comprises a plurality of target units sequentially connected in a series connection in a daisy-chain communication manner, one or more transformer units each connected between every two successive target units of the plurality of target units, and one of the plurality of target units arranged at a first place in the series connection being a main control unit, and the other of the plurality of target units being cell sampling units, the method comprising, for one target unit of the plurality of target units:
acquiring an impedance of at least one transformer unit connected to the target unit; and
judging, based on the acquired impedance, whether to perform circuit abnormality early warning.

20. A battery management system, comprising a cell sampling circuit comprising:
a plurality of target units sequentially connected in a series connection in a daisy-chain communication manner, one of the plurality of target units arranged at a first place in the series connection being a main control unit, and the other of the plurality of target units being cell sampling units; and
one or more transformer units each connected between two successive target units of the plurality of target units;
wherein each of the target units is configured to:
acquire an impedance of at least one transformer unit connected to the target unit; and
judge, based on the acquired impedance, whether to perform circuit abnormality early warning.

* * * * *